US012690395B2

(12) United States Patent
Fukuda et al.

(10) Patent No.: US 12,690,395 B2
(45) Date of Patent: Jul. 21, 2026

(54) MAGNETIC MEMORY DEVICE

(71) Applicant: Kioxia Corporation, Tokyo (JP)

(72) Inventors: Kenji Fukuda, Seoul (KR); Tadaaki Oikawa, Seoul (KR); Kazuya Sawada, Seoul (KR); Soichi Oikawa, Seoul (KR)

(73) Assignee: Kioxia Corporation, Tokyo (JP)

( * ) Notice: Subject to any disclaimer, the term of this patent is extended or adjusted under 35 U.S.C. 154(b) by 148 days.

(21) Appl. No.: 18/829,343

(22) Filed: Sep. 10, 2024

(65) Prior Publication Data

US 2025/0098545 A1     Mar. 20, 2025

(30) Foreign Application Priority Data

Sep. 19, 2023     (JP) ................................. 2023-151502

(51) Int. Cl.
G11C 11/16 (2006.01)
H10B 61/00 (2023.01)
(Continued)

(52) U.S. Cl.
CPC ........... H10N 50/10 (2023.02); G11C 11/161 (2013.01); H10B 61/10 (2023.02); H10B 61/20 (2023.02);
(Continued)

(58) Field of Classification Search
CPC ........ H10N 50/10; H10N 50/85; H10N 50/01; G11C 11/161; G11C 11/1673;
(Continued)

(56) References Cited

U.S. PATENT DOCUMENTS 9,184,375 B1 * 11/2015 Tang ...................... H10N 50/10
2007/0085068 A1 * 4/2007 Apalkov ............. H01F 10/3227
257/1
(Continued)

FOREIGN PATENT DOCUMENTS

JP     2012204683 A     10/2012
JP     2014179428 A     9/2014
JP     2018157091 A     10/2018

OTHER PUBLICATIONS

Thapa, et al., "Stability Performance Comparison of a MT J Memory Device Using Low-Dimensional HfO2, A 1203, La2O3 and h-BN as Composite Dielectric", 2018 IEEE Electron Devices Kolkata Conference, 2018.

*Primary Examiner* — Michael T Tran
(74) *Attorney, Agent, or Firm* — Holtz, Holtz & Volek PC

(57) ABSTRACT

According to one embodiment, a magnetic memory device includes a first ferromagnetic layer having a fixed magnetization direction, a second ferromagnetic layer having a variable magnetization direction, a first nonmagnetic layer provided between the first ferromagnetic layer and the second ferromagnetic layer, and a second nonmagnetic layer provided on an opposite side to a side on which the first nonmagnetic layer is provided with respect to the second ferromagnetic layer. At least one of the first nonmagnetic layer and the second nonmagnetic layer is an oxide layer including magnesium (Mg) and a group 4 element. The group 4 element includes at least one element selected from a group consisting of zirconium (Zr), hafnium (Hf), and rutherfordium (Rf).

20 Claims, 7 Drawing Sheets

(51) Int. Cl.
　　　*H10N 50/10*　　　(2023.01)
　　　*H10N 50/85*　　　(2023.01)
(52) U.S. Cl.
　　　CPC .......... *H10N 50/85* (2023.02); *G11C 11/1673*
　　　　　　　　(2013.01); *G11C 11/1675* (2013.01)
(58) Field of Classification Search
　　　CPC .... G11C 11/1675; H10B 61/22; H10B 61/10;
　　　　　　　　　　　　　　　　　　　H10B 61/20
　　　USPC .................................................. 365/158, 173
　　　See application file for complete search history.

(56)　　　　　　　References Cited

U.S. PATENT DOCUMENTS

| | | |
|---|---|---|
| 2012/0241881 A1 | 9/2012 | Daibo et al. |
| 2014/0247648 A1* | 9/2014 | Yoon .................... H10N 70/841 |
| | | 257/421 |
| 2014/0264673 A1 | 9/2014 | Kitagawa et al. |
| 2016/0380185 A1 | 12/2016 | Kato et al. |
| 2017/0069687 A1 | 3/2017 | Nakayama et al. |
| 2018/0090671 A1 | 3/2018 | Kato et al. |
| 2018/0268887 A1 | 9/2018 | Endo et al. |
| 2019/0058113 A1* | 2/2019 | Ramaswamy ......... H10N 52/80 |
| 2019/0173001 A1 | 6/2019 | Lee et al. |
| 2021/0375518 A1* | 12/2021 | Zheng .................. H03B 15/006 |
| 2023/0269950 A1* | 8/2023 | Oikawa .................. H10N 52/00 |

* cited by examiner

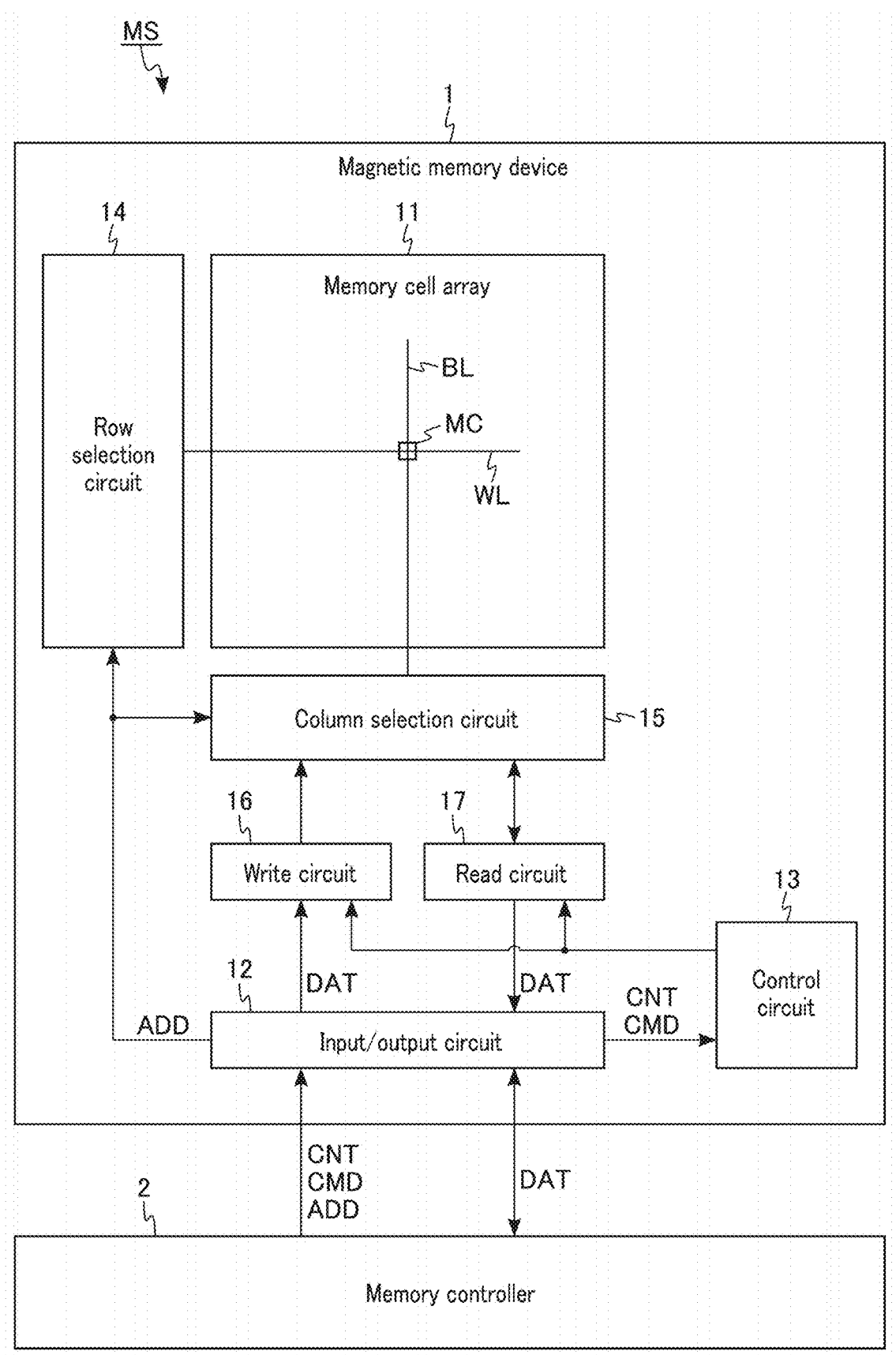
F I G. 1

11
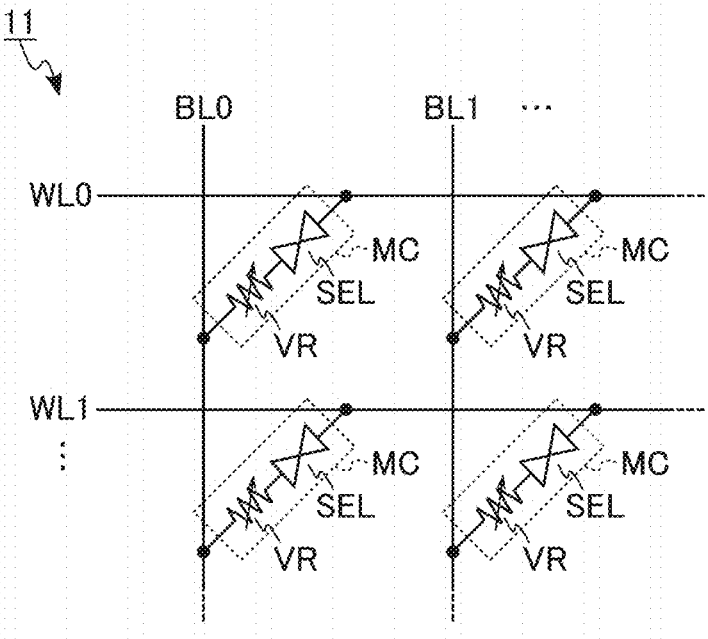
F I G. 2
11
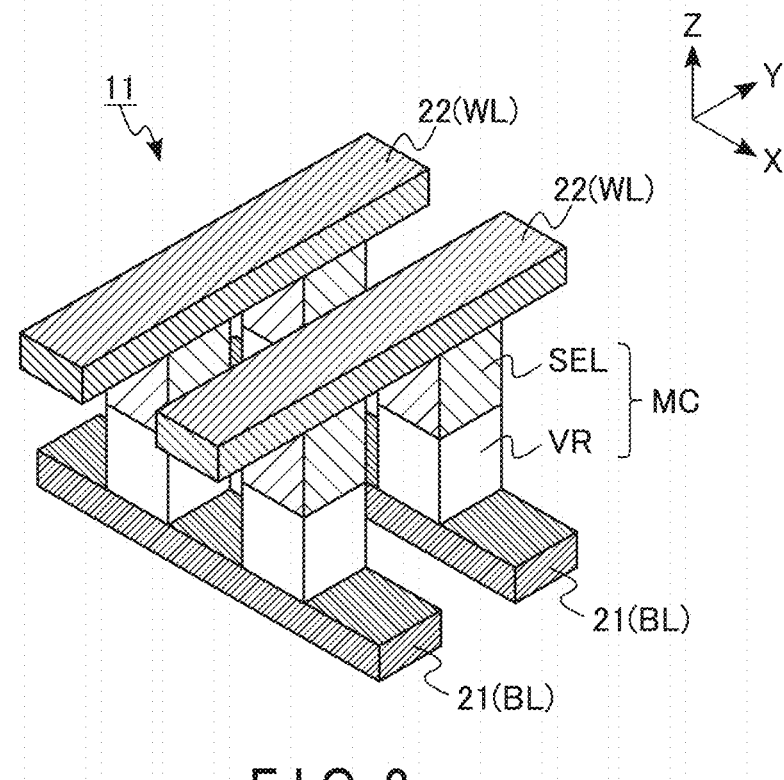
F I G. 3

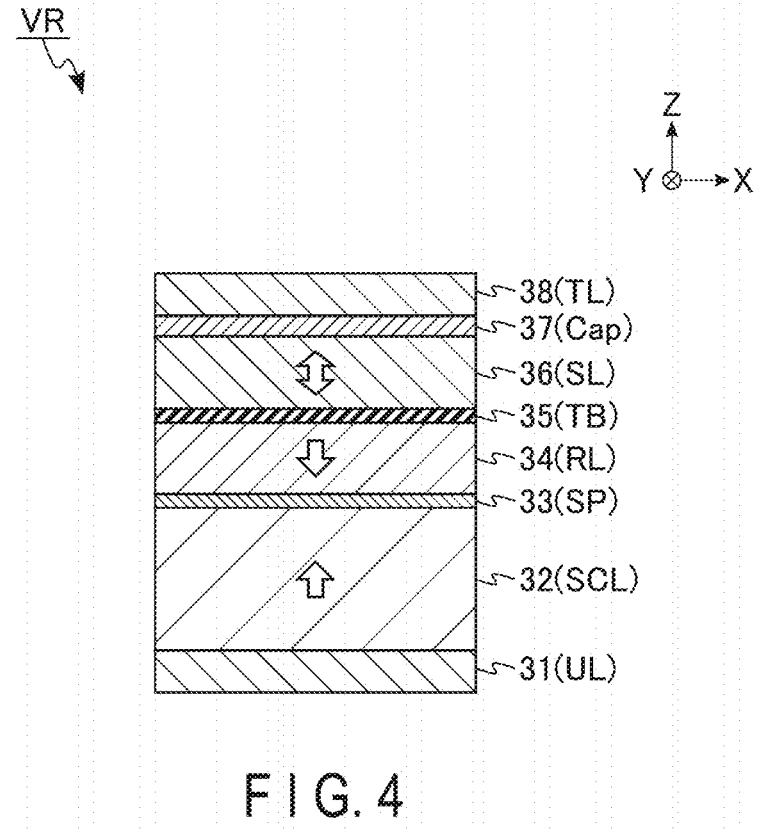
F I G. 4 a_MgXO=4.072 Å a_FeCo=2.842 Å

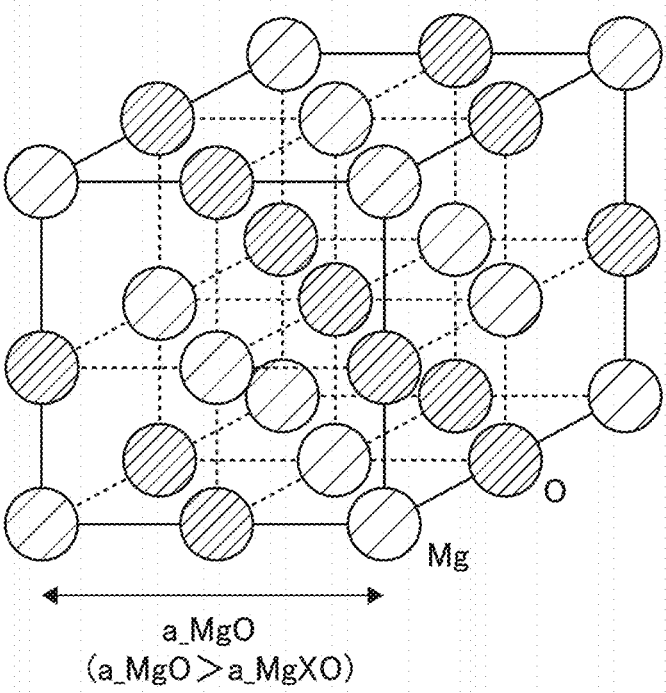
a_MgO
(a_MgO＞a_MgXO)
F I G. 9
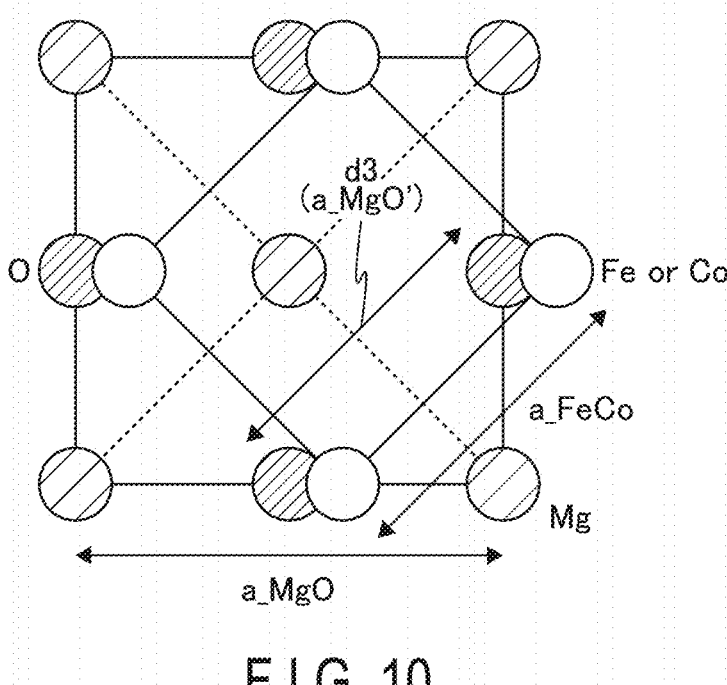
F I G. 10

|  | First configuration example | Second configuration example | Third configuration example |
|---|---|---|---|
| Cross-sectional structure | TL → W<br>Cap → MgO<br>SL → FeCoB<br>TB → Mg-X-O<br>RL → FeCoB | TL → W<br>Cap → Mg-X-O<br>SL → FeCoB<br>TB → MgO<br>RL → FeCoB | TL → W<br>Cap → Mg-X-O<br>SL → FeCoB<br>TB → Mg-X-O<br>RL → FeCoB |
| iPMA | High | High | High |
| RA of Cap |  | Low | Low |
| Reliability of TB | High |  | High |

|  | Fourth configuration example | Fifth configuration example | Comparative example |
|---|---|---|---|
| Cross-sectional structure | TL → W<br>Cap → MgO<br>SL → FeCoB<br>TB → MgO / Mg-X-O / MgO<br>RL → FeCoB | TL → W<br>Cap → Mg-X-O<br>SL → FeCoB<br>TB → MgO / Mg-X-O / MgO<br>RL → FeCoB | TL → W<br>Cap → MgO<br>SL → FeCoB<br>TB → MgO<br>RL → FeCoB |
| iPMA |  | High |  |
| RA of Cap |  | Low |  |
| Reliability of TB | High | High |  |

F I G. 11

MAGNETIC MEMORY DEVICE

CROSS-REFERENCE TO RELATED APPLICATIONS

This application is based upon and claims the benefit of priority from Japanese Patent Application No. 2023-151502, filed Sep. 19, 2023, the entire contents of which are incorporated herein by reference.

FIELD

Embodiments described herein relate generally to a magnetic memory device.

BACKGROUND

A magnetic memory device (Magnetoresistive Random Access Memory (MRAM)) which adopts a magnetoresistive effect element as a memory element is known.

BRIEF DESCRIPTION OF THE DRAWINGS

FIG. 1 is a block diagram showing an example of a configuration of a memory system including a magnetic memory device according to an embodiment.

FIG. 2 is a circuit diagram showing an example of a circuit configuration of a memory cell array included in the magnetic memory device according to the embodiment.

FIG. 3 is a perspective view showing an example of a structure of the memory cell array included in the magnetic memory device according to the embodiment.

FIG. 4 is a cross-sectional view showing an example of a cross-sectional structure of a variable resistance element included in the memory cell of the magnetic memory device according to the embodiment.

FIG. 9 is a perspective view showing a unit lattice of a crystal structure of magnesium oxide.

FIG. 10 is a cross-sectional view showing an example of an interface between a nonmagnetic layer including magnesium oxide and the ferromagnetic layer when they are stacked.

FIG. 11 is a diagram showing an example of characteristics based on a difference between a tunnel barrier layer and a capping layer included in the variable resistance element.

DETAILED DESCRIPTION

Figure 5:
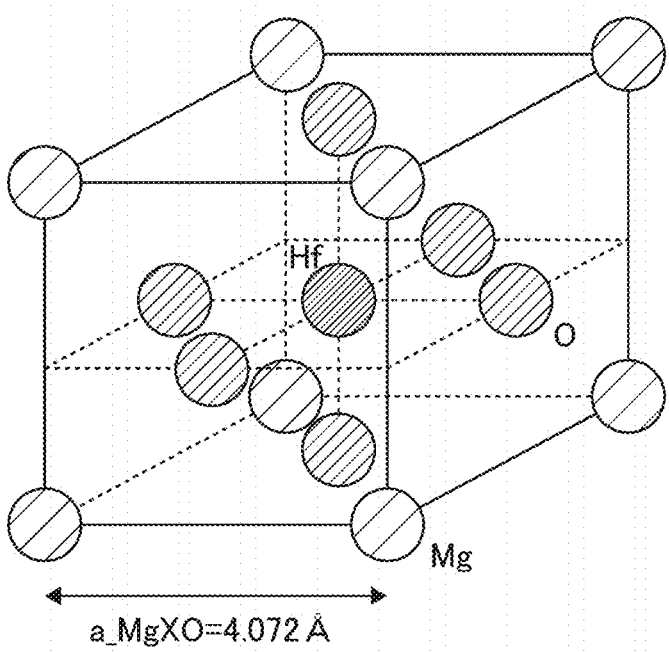
FIG. 5 is a perspective view showing a unit lattice of a crystal structure of an example of a material used for a nonmagnetic layer included in the variable resistance element of the magnetic memory device according to the embodiment.

In general, according to one embodiment, a magnetic memory device includes a first ferromagnetic layer having a fixed magnetization direction, a second ferromagnetic layer having a variable magnetization direction, a first nonmagnetic layer provided between the first ferromagnetic layer and the second ferromagnetic layer, and a second nonmagnetic layer provided on an opposite side to a side on which the first nonmagnetic layer is provided with respect to the second ferromagnetic layer. At least one of the first nonmagnetic layer and the second nonmagnetic layer is an oxide layer including magnesium (Mg) and a group 4 element. The group 4 element includes at least one element selected from a group consisting of zirconium (Zr), hafnium (Hf), and rutherfordium (Rf).

Hereinafter, an embodiment will be described with reference the accompanying drawings. The drawings are schematic or conceptual. The dimensions, ratios, etc. in the drawings are not always the same as the actual ones. In the following description, constituent elements having substantially the same function and configuration will be assigned the same reference symbol. A numeral, etc., following letters constituting a reference symbol is used to distinguish between elements referred to by reference symbols including the same letters and having a similar configuration. In the case where elements represented by reference symbols including the same letters need not be distinguished from each other, they will be referred to by reference symbols including only letters.

1. Embodiment

A magnetic memory device according to an embodiment will be described.

1.1 Configuration 1.1.1 Configuration of Memory System

An example of the configuration of a memory system including a magnetic memory device will be described with reference to FIG. 1. FIG. 1 is a block diagram showing an example of a configuration of the memory system including the magnetic memory device according to the embodiment.

As shown in FIG. 1, a memory system MS includes a magnetic memory device 1 and a memory controller 2. The magnetic memory device 1 operates under control of the memory controller 2. The memory controller 2 may instruct the magnetic memory device 1 to execute a read operation, a write operation, etc. in response to a request (command) from an external host device.

The magnetic memory device 1 is a memory device using a magnetic tunnel junction (MTJ) element for a memory cell, and is a type of variable resistance memory. The MTJ element utilizes a magnetoresistance effect provided by magnetic tunnel junction. The MTJ element may also be referred to as a "magnetoresistance effect element". The magnetic memory device 1 includes, for example, a memory cell array 11, an input/output circuit 12, a control circuit 13, a row selection circuit 14, a column selection circuit 15, a write circuit 16, and a read circuit 17.

The memory cell array 11 includes a plurality of memory cells MC, a plurality of word lines WL, and a plurality of bit lines BL. FIG. 1 shows a set of a memory cell MC, a word line WL, and a bit line BL. The memory cell MC may store data in a nonvolatile manner. The memory cell MC is coupled between the single word line WL and the single bit line BL, and is associated with a pair of a row and a column. A row address is allocated to the word line WL. A column address is allocated to the bit line BL. One or more memory cells MC may be specified by selection of a single row and selection of one or more columns.

The input/output circuit 12 is coupled to the memory controller 2 and controls communications between the magnetic memory device 1 and the memory controller 2. The input/output circuit 12 transfers a control signal CNT and a command CMD received from the memory controller 2 to the control circuit 13. The input/output circuit 12 transfers a row address and a column address included in an address signal ADD received from the memory controller 2 to the row selection circuit 14 and the column selection circuit 15, respectively. The input/output circuit 12 transfers data DAT (write data) received from the memory controller 2 to the write circuit 16. The input/output circuit 12 transfers data DAT (read data) received from the read circuit 17 to the memory controller 2.

The control circuit 13 controls the operation of the entire magnetic memory device 1. For example, the control circuit 13 executes the read operation, the write operation, etc. based on control instructed by the control signal CNT and the command CMD. For example, the control circuit 13 supplies a voltage for use in a write of data to the write circuit 16 during the write operation. In addition, the control circuit 13 supplies a voltage for use in a read of data to the read circuit 17 during the read operation.

The row selection circuit 14 is coupled to a plurality of word lines WL. The row selection circuit 14 selects one word line WL specified by a row address. The selected word line WL is electrically coupled to the driver circuit (not shown), for example.

The column selection circuit 15 is coupled to a plurality of bit lines BL. The column selection circuit 15 selects one or more bit lines BL specified by a column address. The selected bit line BL is electrically coupled to the driver circuit (not shown), for example.

The write circuit 16 supplies, to the column selection circuit 15, the voltage for use in a write of data based on control by the control circuit 13 and the data DAT (write data) received from the input/output circuit 12. In a case where a current based on the write data flows through a memory cell MC, desired data is written in the memory cell MC.

The read circuit 17 includes a sense amplifier. The read circuit 17 supplies the voltage for use in a read of data to the column selection circuit 15 based on control by the control circuit 13. The sense amplifier then determines data stored in the memory cell MC based on a voltage or a current of the selected bit line BL. The read circuit 17 then transfers the data DAT (read data) corresponding to a result of the determination to the input/output circuit 12.

1.1.2 Configuration of Memory Cell Array

Next, an example of a circuit configuration of the memory cell array 11 will be described with reference to FIG. 2. FIG. 2 is a circuit diagram showing an example of a circuit configuration of the memory cell array 11 included in the magnetic memory device 1 according to the embodiment. FIG. 2 shows extracted word lines WL0 and WL1 of the plurality of word lines WL and extracted bit lines BL0 and BL1 of the plurality of bit lines BL.

As shown in FIG. 2, one memory cell MC is coupled between the word line WL0 and the bit line BL0, one memory cell MC is coupled between the word line WL0 and the bit line BL1, one memory cell MC is coupled between the word line WL1 and the bit line BL0, and one memory cell MC is coupled between the word line WL1 and the bit line BL1. Within the memory cell array 11, the plurality of memory cells MC are arranged in a matrix pattern, for example.

The memory cells MC each include a variable resistance element VR and a switching element SEL. The variable resistance element VR and the switching element SEL are coupled in series between their associated bit line BL and word line WL. For example, one end of the variable resistance element VR is coupled to the bit line BL. The other end of the variable resistance element VR is coupled to one end of the switching element SEL. The other end of the switching element SEL is coupled to the word line WL. Meanwhile, a coupling relationship between the variable resistance element VR and the switching element SEL between the bit line BL and the word line WL may be reversed.

Described next is a case in which an MTJ element is used as the variable resistance element VR in the present embodiment. That is, the description of the present embodiment is based on the variable resistance element VR=the MTJ element. The variable resistance element VR may store data in a nonvolatile manner based on its resistance value. For example, the memory cell MC including the variable resistance element VR in a high-resistance state stores "1" data. The memory cell MC including the variable resistance element VR in a low-resistance state stores "0" data. The data allocation associated with a resistance value of the variable resistance element VR may be set differently. A resistance state of the variable resistance element VR may vary in accordance with a current flowing through the variable resistance element VR.

The switching element SEL is, for example, a bidirectional diode. The switching element SEL functions as a selector that controls a supply of a current to its associated variable resistance element VR. Specifically, the switching element SEL included in a memory cell MC is turned to an off state in a case of a voltage applied to this memory cell MC being below a threshold voltage of the switching element SEL, and is turned to an on state in a case of such a voltage being equal to or larger than the threshold voltage of the switching element SEL. The switching element SEL in the off state functions as an insulator having a large resistance value. In a case where the switching element SEL is in the off state, a current is prevented from flowing between the word line WL and the bit line BL both coupled to the memory cell MC concerned. The switching element SEL in the on state has a smaller resistance value than that of the switching element SEL in the off state, thereby allowing a current to easily flow therein. In a case where the switching element SEL is in the on state, a current flows between the word line WL and the bit line BL both coupled to the memory cell MC concerned. That is, the switching element SEL is adapted to switch between allowing and not allowing a current to flow according to the magnitude of a voltage applied to the memory cell MC, regardless of the direction of the current flowing. Meanwhile, as the switching element SEL, other elements, such as a transistor, may be adopted.

1.1.3 Structure of Memory Cell Array

Hereinafter, an example of the structure of the memory cell array 11 will be described. The following description will use an orthogonal coordinate system consisting of an X axis, a Y axis, and a Z axis. An X direction corresponds to the direction in which the bit line BL extends. A Y direction corresponds to the direction in which the word line WL extends. A Z direction corresponds to the direction perpendicular to a surface of a semiconductor substrate used in formation of the magnetic memory device 1. The term "low" and its derivative and related terms refer to a position at a smaller coordinate on the Z axis. The term "up" and its derivative and related terms refer to a position at a larger coordinate on the Z axis. In the perspective views, hatching is added where appropriate. The hatching added to the perspective views is not necessarily related to the materials or characteristics of the hatched constituent elements. The perspective view and the cross-sectional view omit illustration of configurations such as an interlayer insulating film.

1.1.3.1 Three-Dimensional Structure of Memory Cell Array

First, one example of the three-dimensional structure of the memory cell array 11 will be described with reference to FIG. 3. FIG. 3 is a perspective view showing an example of a structure of the memory cell array 11 included in the magnetic memory device 1 according to the embodiment.

As shown in FIG. 3, the memory cell array 11 includes a plurality of conductive layers 21 and a plurality of conductive layers 22.

The conductive layers 21 each have a portion extending in the X direction. The conductive layers 21 are arranged in the Y direction and are separated from each other. The conductive layers 21 are each used as the bit line BL.

The conductive layers 22 each have a portion extending in the Y direction. The conductive layers 22 are arranged in the X direction and are separated from each other. The conductive layers 22 are each used as the word line WL.

An interconnect layer provided with the plurality of conductive layers 22 is provided above an interconnect layer provided with the plurality of conductive layers 21. That is, the conductive layers 22 are spaced apart from the conductive layers 21. One memory cell MC is provided at each of the intersections between the conductive layers 21 and the conductive layers 22. In other words, each memory cell MC is provided in a columnar shape between its associated bit line BL and word line WL. In this example, the variable resistance element VR is provided on the conductive layer 21. The switching element SEL is provided on the variable resistance element VR. The conductive layer 22 is provided on the switching element SEL.

In the example case described above, the variable resistance element VR is provided below the switching element SEL; however, the variable resistance element VR may be provided above the switching element SEL, depending on the circuit configuration of the memory cell array 11. Furthermore, in the example case described above, the word line WL is provided above the bit line BL; however, the bit line BL may be provided above the word line WL.

1.1.3.2 Cross-Sectional Structure of Variable Resistance Element

Next, a cross-sectional structure of the variable resistance element VR will be described with reference to FIG. 4. FIG. 4 is a cross-sectional view showing an example of a cross-sectional structure of the variable resistance element VR included in the memory cell MC of the magnetic memory device 1 according to the embodiment.

As shown in FIG. 4, the variable resistance element VR includes, for example, a nonmagnetic layer 31, a ferromagnetic layer 32, a nonmagnetic layer 33, a ferromagnetic layer 34, a nonmagnetic layer 35, a ferromagnetic layer 36, a nonmagnetic layer 37, and a nonmagnetic layer 38. In FIG. 4, magnetization directions of magnetic layers are indicated by arrows. A bidirectional arrow indicates that a magnetization direction is variable.

The nonmagnetic layer 31, the ferromagnetic layer 32, the nonmagnetic layer 33, the ferromagnetic layer 34, the nonmagnetic layer 35, the ferromagnetic layer 36, the nonmagnetic layer 37, and the nonmagnetic layer 38 are stacked in this order from, for example, the conductive layer 21 (bit line BL) side to the conductive layer 22 (word line WL) side. Specifically, the nonmagnetic layer 31 is provided above the conductive layer 21. The ferromagnetic layer 32 is provided on the nonmagnetic layer 31. The nonmagnetic layer 33 is provided on the ferromagnetic layer 32. The ferromagnetic layer 34 is provided on the nonmagnetic layer 33. The nonmagnetic layer 35 is provided on the ferromagnetic layer 34. The ferromagnetic layer 36 is provided on the nonmagnetic layer 35. That is, the nonmagnetic layer 35 is provided between the ferromagnetic layer 34 and the ferromagnetic layer 36. The nonmagnetic layer 37 is provided on the ferromagnetic layer 36. That is, the nonmagnetic layer 37 is provided on an opposite side to a side on which the nonmagnetic layer 35 is provided, with respect to the ferromagnetic layer 36. The nonmagnetic layer 38 is provided on the nonmagnetic layer 37. The conductive layer 22 is provided above the nonmagnetic layer 38.

The nonmagnetic layer 31 is a nonmagnetic conductor. The nonmagnetic layer 31 is used as an under layer UL. The under layer UL may function as an electrode that enhances the electric connectivity with the bit line BL or the word line WL, for example. The nonmagnetic layer 31 includes, for example, a high-melting-point metal. A high-melting-point metal is a material having a melting point higher than that of iron (Fe) and cobalt (Co), for example. A high-melting-point metal may include, for example, at least one element selected from a group consisting of zirconium (Zr), hafnium (Hf), tungsten (W), chromium (Cr), molybdenum (Mo), niobium (Nb), titanium (Ti), tantalum (Ta), vanadium (V), ruthenium (Ru), and platinum (Pt).

The ferromagnetic layer 32 is a ferromagnetic conductor. The ferromagnetic layer 32 has an easy axis of magnetization in a direction perpendicular to the film face. In the example shown in FIG. 4, the magnetization direction of the ferromagnetic layer 32 corresponds to the direction extending toward the ferromagnetic layer 34. The magnitude of the magnetic field necessary for reversing the magnetization direction of the ferromagnetic layer 32 is, for example, greater than that of the ferromagnetic layer 34. A leakage magnetic field from the ferromagnetic layer 32 reduces the influence of a leakage magnetic field from the ferromagnetic layer 34 on the magnetization direction of the ferromagnetic layer 36. That is, the ferromagnetic layer 32 functions as a shift canceling layer SCL. The ferromagnetic layer 32 includes, for example, at least one element selected from a group consisting of iron (Fe), cobalt (Co), and nickel (Ni). Furthermore, the ferromagnetic layer 32 may include, for example, at least one element selected from a group consisting of platinum (Pt) and palladium (Pd). Specifically, the ferromagnetic layer 32 includes, for example, at least one alloy layer selected from cobalt platinum (CoPt), cobalt nickel (CoNi), and cobalt palladium (CoPd).

The nonmagnetic layer 33 is a nonmagnetic conductor. The nonmagnetic layer 33 is used as a spacer layer SP. By designing the nonmagnetic layer 33 so as to have a certain film thickness, magnetization of the ferromagnetic layer 32 and magnetization of the ferromagnetic layer 34 are anti-ferromagnetically coupled. Based on the above, the magnetization direction of the ferromagnetic layer 32 is fixed to the direction anti-parallel to the magnetization direction of the ferromagnetic layer 34. Such a coupling structure in magnetization between the ferromagnetic layer 32 and the ferromagnetic layer 34 via the nonmagnetic layer 33 is referred to as a synthetic anti-ferromagnetic (SAF) structure. The nonmagnetic layer 33 includes, for example, at least one element selected from a group consisting of ruthenium (Ru), osmium (Os), iridium (Ir), vanadium (V), and chromium (Cr).

The ferromagnetic layer 34 is a ferromagnetic conductor. The ferromagnetic layer 34 has an easy axis of magnetization in a direction perpendicular to the film face. The magnetization direction of the ferromagnetic layer 34 is fixed to the ferromagnetic layer 32 side or the ferromagnetic layer 36 side. Meanwhile, the expression that "the magnetization direction of the ferromagnetic layer 34 is fixed to the ferromagnetic layer 32 side or the ferromagnetic layer 36 side" means that the magnetization direction of the ferromagnetic layer 34 is not varied by a torque large enough to reverse the magnetization direction of the ferromagnetic layer 36. In other words, the above expression means that in a case where a current (or a voltage) for changing the magnetization direction of the ferromagnetic layer 36 is supplied to the variable resistance element VR, the magnetization direction of the ferromagnetic layer 34 remains unvaried between before and after the supply of the current (or the voltage). In the example shown in FIG. 4, the magnetization direction of the ferromagnetic layer 34 is fixed to the ferromagnetic layer 32 side. Thus, the ferromagnetic layer 34 is used as a reference layer RL of the MTJ element. The reference layer RL may be referred to as a "pinned layer" or a "fixed layer". The ferromagnetic layer 34 includes, for example, at least one element selected from a group consisting of iron (Fe), cobalt (Co), and nickel (Ni). The ferromagnetic layer 34 may include, as impurities, at least one element selected from a group consisting of boron (B), phosphorus (P), carbon (C), aluminum (Al), silicon (Si), tantalum (Ta), molybdenum (Mo), chromium (Cr), hafnium (Hf), tungsten (W), and titanium (Ti). Specifically, the ferromagnetic layer 34 includes, for example, iron cobalt boron (FeCoB) or iron boride (FeB).

The nonmagnetic layer 35 is a nonmagnetic insulator. The nonmagnetic layer 35 forms a magnetic tunnel junction in cooperation with the ferromagnetic layers 34 and 36. That is, the nonmagnetic layer 35 functions as a tunnel barrier layer TB of the MTJ element. The nonmagnetic layer 35 functions as a seed material during crystallization processing of the ferromagnetic layers 34 and 36 included in a manufacturing process of the magnetic memory device 1. The aforementioned seed material corresponds to a material that serves as a nucleus for growth of a crystalline film from an interface between the ferromagnetic layers 34 and 36. The nonmagnetic layer 35 is provided between the ferromagnetic layer 34 and the ferromagnetic layer 36. The nonmagnetic layer 35 is, for example, ternary oxide including magnesium (Mg) and a group 4 element, or magnesium oxide (MgO). The group 4 element included in the nonmagnetic layer 35 includes, for example, at least one element selected from a group consisting of titanium (Ti), zirconium (Zr), hafnium (Hf), and rutherfordium (Rf). Specifically, the nonmagnetic layer 35 includes, for example, magnesium titanium oxide ($MgTiO_3$), magnesium zirconium oxide ($MgZrO_3$), magnesium hafnium oxide ($MgHfO_3$), or magnesium rutherfordium oxide ($MgRfo_3$). Hereinafter, ternary oxide including magnesium (Mg) and a group 4 element will also be referred to as "Mg—X—O". X is a group 4 element.

Ternary oxide (Mg—X—O) is relatively similar to magnesium oxide (MgO) in terms of formation energy. Furthermore, magnesium oxide (MgO) can be formed relatively more stably because of its relatively low formation energy. Therefore, as with magnesium oxide (MgO), ternary oxide (Mg—X—O) can be formed relatively stably. Accordingly, using ternary oxide (Mg—X—O) for the nonmagnetic layer 35 realizes relatively stable formation of the nonmagnetic layer 35 as with a case of using magnesium oxide (MgO) for the nonmagnetic layer 35.

Ternary oxide (Mg—X—O) has a narrower band gap than that of magnesium oxide (MgO). Thus, in a case where ternary oxide (Mg—X—O) and magnesium oxide (MgO) are formed so as to have the same film thickness, the ternary oxide (Mg—X—O) is lower in its RA (product of resistance and area) than the magnesium oxide (MgO). This allows ternary oxide (Mg—X—O) to be made thicker in film thickness than magnesium oxide (MgO) while maintaining RA of the same level as that of the magnesium oxide (MgO). As a result, the nonmagnetic layer 35 formed using ternary oxide (Mg—X—O) can suppress breakdown (isolation breakdown) therein as compared to the nonmagnetic layer 35 formed using magnesium oxide (MgO).

Ternary oxide (Mg—X—O) has a function of improving the interfacial perpendicular magnetic anisotropy (iPMA) of the ferromagnetic layer 36. The interfacial perpendicular magnetic anisotropy is perpendicular magnetic anisotropy of a magnetic layer that occurs at the interface between a nonmagnetic layer and the magnetic layer with which the nonmagnetic layer is in direct contact. For example, ternary oxide (Mg—X—O) improves the interfacial perpendicular magnetic anisotropy of the ferromagnetic layer 36 more than magnesium oxide (MgO). As a result, the nonmagnetic layer 35 formed using ternary oxide (Mg—X—O) can improve the interfacial perpendicular magnetic anisotropy of the ferromagnetic layer 36 as compared to the nonmagnetic layer 35 formed using magnesium oxide (MgO). Details will be described later.

The ferromagnetic layer 36 is a ferromagnetic conductor. The ferromagnetic layer 36 has an easy axis of magnetization in a direction perpendicular to the film face. The magnetization direction of the ferromagnetic layer 36 is oriented toward either the ferromagnetic layer 34 side or the nonmagnetic layer 37 side. The magnetization direction of the ferromagnetic layer 36 is configured to be easily reversed as compared to that of the ferromagnetic layer 34. The ferromagnetic layer 36 has a variable magnetization direction. This means that the magnetization direction of the ferromagnetic layer 36 can be varied before (before writing) and after (after writing) a write current is applied to the variable resistance element VR. This allows the ferromagnetic layer 36 to be used as a storage layer SL of the MTJ element. The storage layer SL may be called a "free layer". The ferromagnetic layer 36 includes, for example, at least one element selected from a group consisting of iron (Fe), cobalt (Co), and nickel (Ni). The ferromagnetic layer 36 may include, as impurities, at least one element selected from a group consisting of boron (B), phosphorus (P), carbon (C), aluminum (Al), silicon (Si), tantalum (Ta), molybdenum (Mo), chromium (Cr), hafnium (Hf), tungsten (W), and titanium (Ti). Specifically, the ferromagnetic layer 36 includes, for example, iron cobalt boron (FeCoB) or iron boride (FeB).

The nonmagnetic layer 37 is a nonmagnetic oxide. The nonmagnetic layer 37 is used as a capping layer Cap with respect to the ferromagnetic layer 36 (storage layer SL). The nonmagnetic layer 37 may have a function of suppressing an increase of the damping constant of the ferromagnetic layer 36 and reducing a write current. The nonmagnetic layer 37 is in contact with the ferromagnetic layer 36. The nonmagnetic layer 37 is, for example, ternary oxide including magnesium (Mg) and a group 4 element, or magnesium oxide (MgO). The group 4 element included in the nonmagnetic layer 37 includes, for example, at least one element selected from a group consisting of titanium (Ti), zirconium (Zr), hafnium (Hf), and rutherfordium (Rf). Specifically, the nonmagnetic layer 37 includes, for example, magnesium titanium oxide ($MgTiO_3$), magnesium zirconium oxide ($MgZrO_3$), magnesium hafnium oxide ($MgHfO_3$), or magnesium rutherfordium oxide ($MgRfo_3$).

As mentioned above, the ternary oxide (Mg—X—O) can be formed relatively stably, as with magnesium oxide (MgO). Accordingly, using ternary oxide (Mg—X—O) for the nonmagnetic layer 37 realizes relatively stable formation of the nonmagnetic layer 37 as with a case of using magnesium oxide (MgO) for the nonmagnetic layer 37.

As mentioned above, the ternary oxide (Mg—X—O) has a narrower band gap than that of magnesium oxide (MgO). This allows ternary oxide (Mg—X—O) to decrease RA while maintaining the film thickness at the same level as magnesium oxide (MgO). That is, ternary oxide (Mg—X—O) can reduce a parasitic resistance while maintaining the film thickness at the same level as magnesium oxide (MgO). As a result, the nonmagnetic layer 37 formed using ternary oxide (Mg—X—O) enables a reduction in a write voltage as compared to the nonmagnetic layer 37 formed using magnesium oxide (MgO). In addition, the reduction in parasitic resistance causes an increase in MR (magneto-resistance ratio), thereby increasing a voltage margin between a case of reading a memory cell MC including a variable resistance element VR in a low-resistance state and a case of reading a memory cell MC including a variable resistance element VR in a high-resistance state. As a result, the nonmagnetic layer 37 formed using ternary oxide (Mg—X—O) enables improvement in read error as compared to the nonmagnetic layer 37 formed using magnesium (MgO).

As described above, ternary oxide (Mg—X—O) improves the interfacial perpendicular magnetic anisotropy of the ferromagnetic layer 36 more than magnesium oxide (MgO). As a result, the nonmagnetic layer 37 formed using ternary oxide (Mg—X—O) can improve the interfacial perpendicular magnetic anisotropy of the ferromagnetic layer 36 as compared to the nonmagnetic layer 37 formed using magnesium oxide (MgO). Details will be described later.

With respect to the nonmagnetic layers 35 and 37, one of them may be ternary oxide (Mg—X—O) or both of them may be ternary oxide (Mg—X—O).

The nonmagnetic layer 38 is a nonmagnetic conductor. The nonmagnetic layer 38 is used as a top layer TL. The top layer TL may function as, for example, a hard mask or an electrode that enhances the electric connectivity with the word line WL or the bit line BL. The nonmagnetic layer 38 includes, for example, at least one element or compound selected from a group consisting of tungsten (W), tantalum (Ta), tantalum nitride (TaN), titanium (Ti), titanium nitride (TiN), ruthenium (Ru), molybdenum (Mo), and hafnium (Hf).

The variable resistance element VR described above functions as an MTJ element of a perpendicular-magnetization type utilizing a tunneling magnetoresistance (TMR) effect. The variable element VR may take either a low-resistance state or a high-resistance state, depending on the relative relationship between the magnetization directions of the ferromagnetic layers 34 and 36. Specifically, the variable resistance element VR turns to the high-resistance state in a case of the magnetization directions of the reference layer RL and the storage layer SL being anti-parallel (in an anti-parallel (AP) state), and turns to the low-resistance state in a case of the magnetization directions of the reference layer RL and the storage layer SL being parallel (in a parallel (P) state).

The magnetic memory device 1 can cause the memory cell MC to store desired data by varying the magnetization direction of the ferromagnetic layer 36 (storage layer SL). Specifically, the magnetic memory device 1 injects spin torque into the storage layer SL and the reference layer RL by causing the write current to flow through the variable resistance element VR, thereby controlling the magnetization direction of the storage layer SL. This write method is called a "spin injection write method".

In this example, the variable resistance element VR turns to the AP state in a case of the write current flowing in the direction extending from the ferromagnetic layer 34 to the ferromagnetic layer 36, and turns to the P state in a case of the write current flowing in the direction extending from the ferromagnetic layer 36 to the ferromagnetic layer 34. The variable resistance element VR is configured such that the magnetization direction of the ferromagnetic layer 34 does not vary in a case where a current large enough to reverse the magnetization direction of the ferromagnetic layer 36 is caused to flow through in the variable resistance element VR. That is, the expression that "the magnetization direction is fixed" means that the magnetization direction is not varied by a current large enough to reverse the magnetization direction of the ferromagnetic layer 36.

The variable resistance element VR may include another layer and each of the magnetic layers may be comprised of a plurality of layers. For example, the ferromagnetic layer 34 may be a layer stack including a plurality of layers. The layer stack constituting the ferromagnetic layer 34 may include a layer that includes iron cobalt boron (FeCoB) or iron boride (FeB) as an interface layer with the nonmagnetic layer 35, and may further include a ferromagnetic layer between the interface layer and the nonmagnetic layer 33 via a nonmagnetic conductor, for example.

1.2 Interfacial Perpendicular Magnetic Anisotropy

Next, the interfacial perpendicular magnetic anisotropy will be described. The interfacial perpendicular magnetic anisotropy is developed by coupling between an iron (Fe) atom or a cobalt (Co) atom included in a magnetic layer and an oxygen (O) atom included in a nonmagnetic layer in contact with the magnetic layer. Specifically, the interfacial perpendicular magnetic anisotropy is developed in a case where, for example, the nonmagnetic layer 35 includes an oxygen (O) atom and the ferromagnetic layer 36 includes an iron (Fe) atom or cobalt (Co) atom, or where the ferromagnetic layer 36 includes an iron (Fe) atom or cobalt (Co) atom and the nonmagnetic layer 37 includes an oxygen (O) atom.

The following will describe, as an example, an interfacial perpendicular magnetic anisotropy in a case where the nonmagnetic layer 35 including a ternary oxide (Mg—X—O) and the ferromagnetic layer 36 including iron cobalt boron (FeCoB) are stacked.

In a case of forming a film of iron cobalt boron (FeCoB) as the ferromagnetic layer 36, the ferromagnetic layer 36 has an amorphous structure. After all of the layers (layers 31 to 38) are stacked, annealing processing is performed as crystallization processing of the ferromagnetic layer 36. An annealing temperature is, for example, 350° C. Boron (B) is released from the ferromagnetic layer 36 through the annealing processing. As a result, iron (Fe) and cobalt (Co) remain in the ferromagnetic layer 36. In reality, boron (B) also remains in the ferromagnetic layer 36; however, the amount of remaining boron (B) is relatively small. For this reason, the ferromagnetic layer 36 after the annealing processing is performed is considered to have an iron cobalt (FeCo) crystal structure. Therefore, the interfacial perpendicular magnetic anisotropy in a case where ternary oxide (Mg—X—O) and iron cobalt (FeCo) are stacked will be described below.

(Structure of Ternary Oxide)

A structure of ternary oxide (Mg—X—O) will be described with reference to FIG. 5. FIG. 5 is a perspective view showing a unit lattice of a crystal structure of ternary oxide (Mg—X—O) which is an example of a material used for the nonmagnetic layers 35 and 37 included in the variable resistance element VR of the magnetic memory device 1 according to the embodiment. FIG. 5 shows a crystal structure of $MgHfO_3$ as an example of the crystal structure of ternary oxide (Mg—X—O). Meanwhile, crystal structures of $MgTiO_3$, $MgZrO_3$, and $MgRfo_3$ are also similar to the crystal structure shown in FIG. 5.

Ternary oxide (Mg—X—O) has a perovskite structure. The perovskite structure has a cubic unit lattice. In ternary oxide (Mg—X—O), a magnesium (Mg) atom is located at each vertex of a unit lattice, an X atom is located at the center (body center) of the unit lattice, and an oxygen (O) atom is located at the center (face center) of each surface of the unit lattice. In the example shown in FIG. 5, a hafnium (Hf) atom is located at the center of the unit lattice. The lattice constant (length of one side of the unit lattice), a_MgXO is, for example, 4.072 Å.

The upper surface of the unit lattice of ternary oxide (Mg—X—O) is expressed as a (001) face using the Miller index, for example. A magnesium (Mg) atom is located at each vertex of the (001) face, and an oxygen (O) atom is located at the center of the (001) face. Hereinafter, the (001) face of the unit lattice of ternary oxide (Mg—X—O) and faces equivalent to the (001) face (for example, the (100) face, the (010) face, etc.) are collectively expressed as a {001}face group of the unit lattice of ternary oxide (Mg—X—O). Furthermore, one discretionary face included in the {001}face group of the unit lattice of ternary oxide (Mg—X—O) will be referred to as a "first face S1."

A face passing through the midpoint of each of the four vertical sides of the unit lattice of ternary oxide (Mg—X—O) is expressed as a (002) face using the Miller index, for example. An X atom is located at the center of the (002) face, and an oxygen (O) atom is located at the midpoint of each side of the (002) face. In the example shown in FIG. 5, a hafnium (Hf) atom is located at the center of the (002) face. Hereinafter, the (002) face of the unit lattice of ternary oxide (Mg—X—O) and faces equivalent to the (002) face (for example, the (200) face, the (020) face, etc.) will be collectively referred to as a {002}face group of the unit lattice of ternary oxide (Mg—X—O). Furthermore, one discretionary face included in the {002}face group of the unit lattice of ternary oxide (Mg—X—O) will be referred to as a "second face S2".

In ternary oxide (Mg—X—O), for example, the first face S1 or the second face S2 may serve as a surface.

(Structure of Iron Cobalt)

Figure 6:
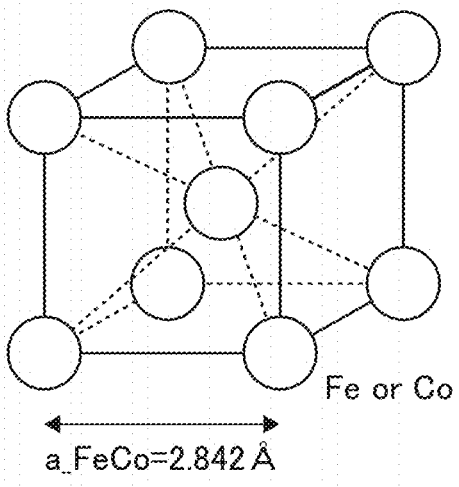
FIG. 6 is a perspective view showing a unit lattice of a crystal structure of an example of a material used for a ferromagnetic layer included in the variable resistance element of the magnetic memory device according to the embodiment.

A structure of iron cobalt (FeCo) will be described with reference to FIG. 6. FIG. 6 is a perspective view showing a unit lattice of a crystal structure of iron cobalt (FeCo) which is an example of a material used for the ferromagnetic layer 36 included in the variable resistance element VR of the magnetic memory device 1 according to the embodiment.

Iron cobalt (FeCo) has a body-centered cubic lattice structure. The body-centered cubic lattice structure has a cubic unit lattice. In iron cobalt (FeCo), an iron (Fe) atom or a cobalt (Co) atom is located at each vertex and the center (body center) of the unit lattice. The lattice constant a_FeCo is, for example, 2.842 Å.

In a unit lattice of iron cobalt (FeCo), an iron (Fe) atom or a cobalt (Co) atom is located at each vertex of the (001) face. Hereinafter, the (001) face of the unit lattice of iron cobalt (FeCo) and faces equivalent to the (001) face will be collectively referred to as a {001}face group of the unit lattice of iron cobalt (FeCo).

Furthermore, one discretionary face included in the {001}face group of the unit lattice of iron cobalt (FeCo) will be referred to as a "third face S3". In iron cobalt (FeCo), for example, the third face S3 may serve as a surface.

(Stacked Structure of Ternary Oxide and Iron Cobalt)

A stacked structure of ternary oxide (Mg—X—O) and iron cobalt (FeCo) will be described. As described above, in ternary oxide (Mg—X—O), for example, the first face S1 or the second face S2 may serve as a surface. In iron cobalt (FeCo), for example, the third face S3 may serve as a surface. Thus, examples of the stacked structure of ternary oxide (Mg—X—O) and iron cobalt (FeCo) include a structure (hereinafter also referred to as a "first stacked structure") in which the first face S1 corresponds to a surface of ternary oxide (Mg—X—O), the third face S3 corresponds to a surface of iron cobalt (FeCo), and the third face S3 of iron cobalt (FeCo) is stacked on the first face S1 of ternary oxide (Mg—X—O). The examples further include a structure (hereinafter also referred to as a "second stacked structure") in which the second face S2 corresponds to a surface of ternary oxide (Mg—X—O), the third face S3 corresponds to a surface of iron cobalt (FeCo), and the third face S3 of iron cobalt (FeCo) is stacked on the second face S2 of ternary oxide (Mg—X—O).

Figure 7:
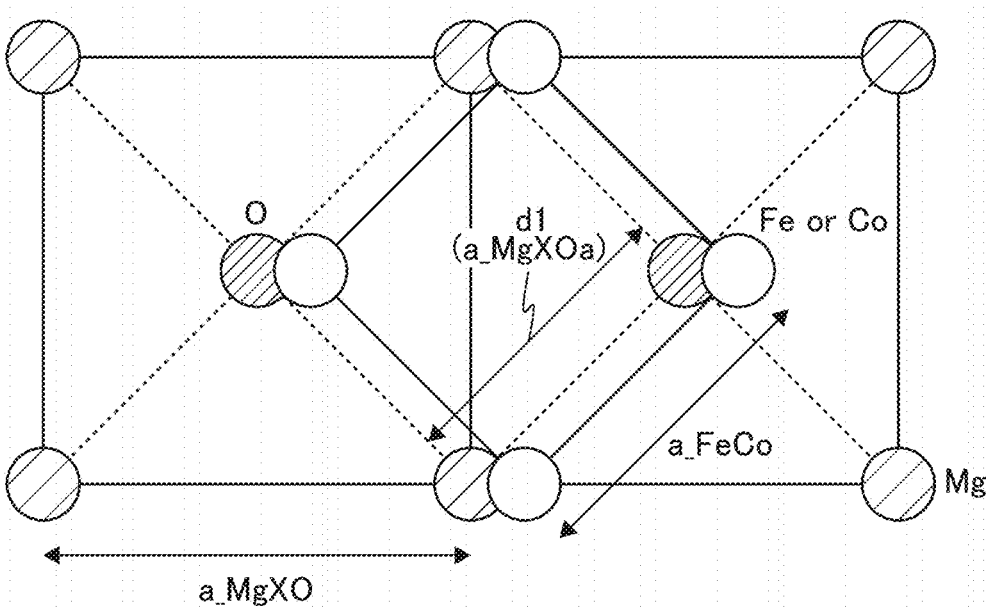
FIG. 7 is a cross-sectional view showing an example of an interface between the nonmagnetic layer and the ferromagnetic layer both included in the variable resistance element of the magnetic memory device according to the embodiment when the nonmagnetic layer and the ferromagnetic layer are stacked.

First, the first stacked structure will be described. FIG. 7 is a cross-sectional view showing an example of an interface between the nonmagnetic layer 35 and the ferromagnetic layer 36 both included in the variable resistance element VR of the magnetic memory device 1 according to the embodiment when the nonmagnetic layer 35 and the ferromagnetic layer 36 are stacked.

In the first stacked structure, for example, as shown in FIG. 7, the third face S3 of iron cobalt (FeCo) rotated by 45 degrees is stacked on the first faces S1 of two ternary oxides (Mg—X—O) which are placed side by side. As a result, an iron (Fe) atom or a cobalt (Co) atom is stacked on a magnesium (Mg) atom. An iron (Fe) atom or a cobalt (Co) atom is stacked on an oxygen (O) atom. In FIG. 7, for the sake of clarity, a magnesium (Mg) atom and an iron (Fe) atom or a cobalt (Co) atom are shifted from each other, and an oxygen (O) atom and an iron (Fe) atom or a cobalt (Co) atom are shifted from each other. A distance d1 (hereinafter also referred to as a "lattice constant a_MgXOa") between a magnesium (Mg) atom and an oxygen (O) atom in the first stacked structure is expressed as a_MgXO×1/√2.

In the stacking direction (vertical direction), in a case where an iron (Fe) atom or a cobalt (Co) atom is located directly above or directly below an oxygen (O) atom, in other words, in the stacking direction, in a case where an iron (Fe) atom or a cobalt (Co) atom overlaps an oxygen (O) atom, a coupling between the iron (Fe) atom or the cobalt (Co) atom and the oxygen (O) atom becomes strongest. At this time, the interfacial perpendicular magnetic anisotropy of the ferromagnetic layer 36 becomes highest.

Whether or not an iron (Fe) atom or a cobalt (Co) atom overlaps an oxygen (O) atom in the stacking direction depends on the lattice constant of the crystal structure of the nonmagnetic layer 35 and the lattice constant of the crystal structure of the ferromagnetic layer 36 (in the example shown in FIG. 7, a lattice constant d1 of ternary oxide (Mg—X—O) and a lattice constant of iron cobalt (FeCo)). In a case where the lattice constant of the crystal structure of the nonmagnetic layer 35 corresponds to the lattice constant of the crystal structure of the ferromagnetic layer 36, an iron (Fe) atom or a cobalt (Co) atom overlaps an oxygen (O) atom in the stacking direction. On the other hand, in a case where these lattice constants do not correspond to each other, that is, in a case where there is a difference (deviation) in these lattice constants, an iron (Fe) atom or a cobalt (Co) atom does not overlap an oxygen (O) atom in the stacking direction.

For example, a lattice mismatch rate LMR is used as an index representing a deviation of a lattice constant. The lattice mismatch rate LMR is, for example, expressed as $(\Delta a/a1) \times 100[\%]$ which is a ratio of a difference $\Delta a$ between a lattice constant a1 of one material and a lattice constant a2 of the other material to the lattice constant a1 of the material. As the absolute value of the lattice mismatch ratio LMR decreases, the interfacial perpendicular magnetic anisotropy of the ferromagnetic layer 36 increases. As the interfacial perpendicular magnetic anisotropy of the ferromagnetic layer 36 increases, it becomes more difficult to reverse the magnetization direction of the ferromagnetic layer 36.

For example, in a case of the first stacked structure, the lattice mismatch rate LMR=$((d1-a\_FeCo)/a\_FeCo) \times 100$=$((a\_MgXOa-a\_FeCo)/a\_FeCo) \times 100$. The lattice constant a_MgXOa $(=a\_MgXO \times 1b/\sqrt{2}=4.072 \times 1/\sqrt{2})$ is greater than the lattice constant a_FeCo (=2.842). In a case of the lattice constant a_MgXOa being greater than the lattice constant a_FeCo, the lattice mismatch rate LMR becomes a positive value. In other words, in a case of the lattice mismatch rate LMR being a positive value, an area of a square consisting of a magnesium (Mg) atom and an oxygen (O) atom of ternary oxide (Mg—X—O) is greater than an area of a square consisting of an iron (Fe) atom or a cobalt (Co) atom of iron cobalt (FeCo). On the other hand, in a case of the lattice constant a_MgXOa being smaller than the lattice constant a_FeCo, the lattice mismatch rate LMR becomes a negative value. In other words, in a case of the lattice mismatch rate LMR being a negative value, an area of a square consisting of a magnesium (Mg) atom and an oxygen (O) atom of ternary oxide (Mg—X—O) is smaller than an area of a square consisting of an iron (Fe) atom or a cobalt (Co) atom of iron cobalt (FeCo). As described above, the lattice mismatch ratio LMR takes a positive value or a negative value. Thus, as the absolute value of the lattice mismatch ratio LMR decreases, the interfacial perpendicular magnetic anisotropy of the ferromagnetic layer 36 increases.

Figure 8:
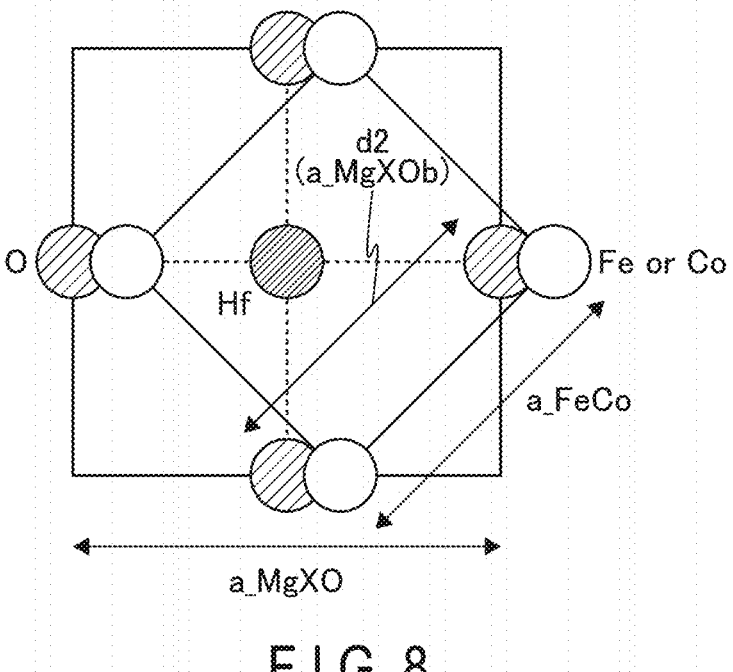
FIG. 8 is a cross-sectional view showing another example of an interface between the nonmagnetic layer and the ferromagnetic layer both included in the variable resistance element of the magnetic memory device according to the embodiment when the nonmagnetic layer and the ferromagnetic layer are stacked.

Next, the second stacked structure will be described. FIG. 8 is a cross-sectional view showing another example of an interface between the nonmagnetic layer 35 and the ferromagnetic layer 36 both included in the variable resistance element VR of the magnetic memory device 1 according to the embodiment when the nonmagnetic layer 35 and the ferromagnetic layer 36 are stacked.

In the second stacked structure, for example, as shown in FIG. 8, the third face S3 of iron cobalt (FeCo) rotated by 45 degrees is stacked on the second faces S2 of ternary oxides (Mg—X—O). As a result, an iron (Fe) atom or a cobalt (Co) atom is stacked on an oxygen (O) atom. In FIG. 8, for the sake of clarity, an oxygen (O) atom and an iron (Fe) atom or a cobalt (Co) atom are shifted from each other. A distance d2 (hereinafter also referred to as a "lattice constant a_MgXOb") between oxygen (O) atoms in the second stacked structure is expressed as a_MgXO×1/$\sqrt{2}$.

For example, in a case of the second stacked structure, the lattice mismatch rate LMR=$((d2-a\_FeCo)/a\_FeCo) \times 100$=$((a\_MgXOb-a\_FeCo)/a\_FeCo) \times 100$. The lattice constant a_MgXOb $(=a\_MgXO \times 1/\sqrt{2}=4.072 \times 1/\sqrt{2})$ is greater than the lattice constant a_FeCo (=2.842).

Herein, the interfacial perpendicular magnetic anisotropy in a case where magnesium oxide (MgO) and iron cobalt (FeCo) are stacked will be described.

(Structure of Magnesium Oxide)

A structure of magnesium oxide (MgO) will be described with reference to FIG. 9. FIG. 9 is a perspective view showing a unit lattice of a crystal structure of magnesium oxide (MgO).

Magnesium oxide (MgO) has a NaCl type structure. The NaCl type structure has a cubic unit lattice. In magnesium oxide (MgO), a magnesium (Mg) atom is located at each vertex of a unit lattice and the center (face center) of each face of the unit lattice, and an oxygen (O) atom is located at the center (body center) of the unit lattice and the midpoint of each side. The lattice constant a_MgO is greater than the lattice constant a_MgXO of ternary oxide (Mg—X—O).

In a unit lattice of magnesium oxide (MgO), a magnesium (Mg) atom is located at each vertex and the center of the (001) face, and an oxygen (O) atom is located at the midpoint of each side of the (001) face. Hereinafter, the (001) face of the unit lattice of magnesium oxide (MgO) and faces equivalent to the (001) face will be collectively referred to as a {001}face group of the unit lattice of magnesium oxide (MgO). Furthermore, one discretionary face included in the {001}face group of the unit lattice of magnesium oxide (MgO) will be referred to as a "fourth face S4." In magnesium oxide (MgO), for example, a fourth face S4 may serve as a surface.

(Stacked Structure of Magnesium Oxide and Iron Cobalt)

A stacked structure of magnesium oxide (MgO) and iron cobalt (FeCo) will be described. As described above, in magnesium oxide (MgO), for example, the fourth face S4 may serve as a surface. In iron cobalt (FeCo), for example, the third face S3 may serve as a surface. Thus, examples of the stacked structure of magnesium oxide (MgO) and iron cobalt (FeCo) include a structure (hereinafter also referred to as a "third stacked structure") in which the fourth face S4 corresponds to a surface of magnesium oxide (MgO), the third face S3 corresponds to a surface of iron cobalt (FeCo), and the third face S3 of iron cobalt (FeCo) is stacked on the fourth face S4 of magnesium oxide (MgO).

The third stacked structure will be described. FIG. 10 is a cross-sectional view showing an example of the interface between the nonmagnetic layer 35 and the ferromagnetic layer 36 when the nonmagnetic layer 35 including magnesium oxide (MgO) and the ferromagnetic layer 36 are stacked.

In the third stacked structure, for example, as shown in FIG. 10, the third face S3 of iron cobalt (FeCo) rotated by 45 degrees is stacked on the fourth face S4 of magnesium oxide (MgO). As a result, an iron (Fe) atom or a cobalt (Co) atom is stacked on an oxygen (O) atom. In FIG. 10, for the sake of clarity, an oxygen (O) atom and an iron (Fe) atom or a cobalt (Co) atom are shifted from each other. A distance d3 (hereinafter also referred to as "lattice constant a_MgO") between oxygen (O) atoms in the third stacked structure is expressed as a_MgO×1/$\sqrt{2}$.

As described above, the lattice constant a_MgO is greater than the lattice constant a_MgXO. Therefore, the lattice constant a_MgO' is greater than the lattice constant a_MgXOa and the lattice constant a_MgXOb. Furthermore, the lattice constants a_MgXOa and a_MgXOb are greater than the lattice constant a_FeCo. Accordingly, the difference between the lattice constant a_MgXOa (a_MgXOb) and the lattice constant a_FeCo is smaller than the difference between the lattice constant a_MgO' and the lattice constant a_FeCo.

Therefore, the lattice mismatch rate LMR of the first stacked structure and the lattice mismatch rate LMR of the second stacked structure are smaller than the lattice mismatch rate LMR of the third stacked structure. As a result, the ferromagnetic layer 36 in the first stacked structure and the ferromagnetic layer 36 in the second stacked structure are higher in interfacial perpendicular magnetic anisotropy per coupling between an iron (Fe) atom or a cobalt (Co) atom and an oxygen (O) atom than the ferromagnetic layer 36 in the third stacked structure.

The number of couplings between an iron (Fe) atom or a cobalt (Co) atom and an oxygen (O) atom in the first stacked structure is ½ of the number of couplings between an iron (Fe) atom or a cobalt (Co) atom and an oxygen (O) atom in the third stacked structure. Therefore, the contribution to the interfacial perpendicular magnetic anisotropy of the ferromagnetic layer 36 by the coupling between an iron (Fe) atom or a cobalt (Co) atom and an oxygen (O) atom in the first stacked structure is ½ of that in the third stacked structure.

The number of couplings between an iron (Fe) atom or a cobalt (Co) atom and an oxygen (O) atom in the second stacked structure is equal to the number of couplings between an iron (Fe) atom or a cobalt (Co) atom and an oxygen (O) atom in the third stacked structure. Therefore, the contribution to the interfacial perpendicular magnetic anisotropy of the ferromagnetic layer 36 by the coupling between an iron (Fe) atom or a cobalt (Co) atom and an oxygen (O) atom in the second stacked structure is equal to that in the third stacked structure.

The interfacial perpendicular magnetic anisotropy in a case where the ferromagnetic layer 36 including iron cobalt boron (FeCoB) and the nonmagnetic layer 37 including ternary oxide (Mg—X—O) are stacked is similar to that in a case where the nonmagnetic layer 35 including ternary oxide (Mg—X—O) and the ferromagnetic layer 36 including iron cobalt boron (FeCoB) are stacked. In this case, examples of the stacked structure of ternary oxide (Mg—X—O) and iron cobalt (FeCo) include a structure (hereinafter also referred to as a "fourth stacked structure") in which the first face S1 of ternary oxide (Mg—X—O) is stacked on the third face S3 of iron cobalt (FeCo). The examples further include a structure (hereinafter also referred to as a "fifth stacked structure") in which the second face S2 of ternary oxide (Mg—X—O) is stacked on the third face S3 of iron cobalt (FeCo). As with the first stacked structure and the second stacked structure, the ferromagnetic layer 36 in the fourth stacked structure and the ferromagnetic layer 36 in the fifth stacked structure are higher in interfacial perpendicular magnetic anisotropy per coupling between an iron (Fe) atom or a cobalt (Co) atom and an oxygen (O) atom than the ferromagnetic layer 36 in the third stacked structure.

$MgHfO_3$ is smaller in lattice mismatch rate LMR with FeCo than $MgTiO_3$ and $MgZrO_3$. Therefore, $MgHfO_3$ is higher in interfacial perpendicular magnetic anisotropy of FeCo, which is developed by coupling with FeCo, than $MgTiO_3$ and $MgZrO_3$.

Furthermore, formation energy of $MgHfO_3$ is on the same level with that of MgO. $MgHfO_3$ is smaller in formation energy than $MgTiO_3$ and $MgZrO_3$. Thus, it is easier to form $MgHfO_3$ than $MgTiO_3$ and $MgZrO_3$.

Accordingly, it is more preferable that hafnium (Hf) be selected as the group 4 element included in the nonmagnetic layers 35 and 37, for example.

1.3 Comparison of Characteristics Based on Difference Between Tunnel Barrier Layer and Capping Layer Next, characteristics based on a difference between the tunnel barrier layer TB and the capping layer Cap will be described with reference to FIG. 11. FIG. 11 is a diagram showing an example of characteristics based on a difference between the tunnel barrier layer TB and the capping layer Cap included in the variable resistance element VR. FIG. 11 shows first to fifth configuration examples based on the present embodiment and a comparative example. A cross-sectional structure of each example in FIG. 11 extracts the ferromagnetic layer 34 (reference layer RL), the nonmagnetic layer 35 (tunnel barrier layer TB), the ferromagnetic layer 36 (storage layer SL), the nonmagnetic layer 37 (capping layer Cap), and the nonmagnetic layer 38 (top layer TL) in a layer structure corresponding to the variable resistance element VR formed on a silicon substrate.

Meanwhile, RA of the MTJ element is equivalent to a sum of RA of the tunnel barrier layer TB and RA of the capping layer Cap. RA of the tunnel barrier layer TB varies in resistance due to a magnetoresistance effect. On the other hand, RA of the capping layer Cap does not vary in resistance and thus exhibits parasitic resistance. RA of the tunnel barrier layer TB is set to be the same value among the first to fifth configuration examples and the comparative example. Thus, the second configuration example and the comparative example are substantially the same in terms of a film thickness of the tunnel barrier layer TB. The fourth configuration example and the fifth configuration example are substantially the same and are greater than the second configuration example and the comparative example in terms of a film thickness of the tunnel barrier layer TB. The first configuration example and the third configuration example are substantially the same and are greater than the fourth configuration example and the fifth configuration example in terms of a film thickness of the tunnel barrier layer TB. The first to fifth configuration examples and the comparative example are substantially the same in terms of a film thickness and a size of each of the layers other than the tunnel barrier layer TB.

Furthermore, the first to fifth configuration examples and the comparative example in FIG. 11 are designed to be equal in terms of a film thickness of the capping layer Cap.

Furthermore, FIG. 11 shows characteristics of the first to fifth configuration examples in comparison with the comparison example (interfacial perpendicular magnetic anisotropy iPMA of the storage layer SL, RA of the capping layer Cap, and reliability of the tunnel barrier layer TB).

As shown in FIG. 11, iron cobalt boron (FeCoB) is used for the reference layers RL and the storage layers SL in the first to fifth configuration examples and the comparative example. Tungsten (W) is used for the top layers TL in the first to fifth configuration examples and the comparative example. Magnesium oxide (MgO) is used for the tunnel barrier layer TB and the capping layer Cap in the comparative example.

The first configuration example differs from the comparative example in terms of the tunnel barrier layer TB. Specifically, ternary oxide (Mg—X—O) is used for the tunnel barrier layer TB in the first configuration example. Magnesium oxide (MgO) is used for the capping layer Cap in the first configuration example.

The second configuration example differs from the first configuration example in terms of the tunnel barrier layer TB and the capping layer Cap. Specifically, magnesium oxide (MgO) is used for the tunnel barrier layer TB in the second configuration example. Ternary oxide (Mg—X—O) is used for the capping layer Cap in the second configuration example.

The third configuration example differs from the first configuration example in terms of the capping layer Cap. Specifically, ternary oxide (Mg—X—O) is used for the capping layer Cap in the third configuration example. Ternary oxide (Mg—X—O) is used for the tunnel barrier layer TB in the third configuration example.

The fourth configuration example differs from the first configuration example in terms of the tunnel barrier layer TB. Specifically, a structure in which magnesium oxide (MgO), ternary oxide (Mg—X—O), and magnesium oxide (MgO) are stacked in this order is used for the tunnel barrier layer TB in the fourth configuration example. Magnesium oxide (MgO) is used for the capping layer Cap in the fourth configuration example.

The fifth configuration example differs from the fourth configuration example in terms of the capping layer Cap. Specifically, ternary oxide (Mg—X—O) is used for the capping layer Cap in the fifth configuration example. A structure in which magnesium oxide (MgO), ternary oxide (Mg—X—O), and magnesium oxide (MgO) are stacked in this order is used for the tunnel barrier layer TB in the fifth configuration example.

(Interfacial Perpendicular Magnetic Anisotropy of Storage Layer SL)

In the first configuration example, the tunnel barrier layer TB includes ternary oxide (Mg—X—O), and the storage layer SL is in contact with ternary oxide (Mg—X—O) in the tunnel barrier layer TB. Herein, assume that ternary oxide (Mg—X—O) in the tunnel barrier layer TB and iron cobalt (FeCo) in the storage layer SL in the first configuration example take the second stacked structure. In this case, the lattice mismatch rate LMR between the tunnel barrier layer TB and the storage layer SL in the first configuration example is smaller than the lattice mismatch rate LMR between the tunnel barrier layer TB and the storage layer SL in the comparative example. Accordingly, the first configuration example is greater than the comparative example in terms of interfacial perpendicular magnetic anisotropy of the storage layer SL.

In the second configuration example, the capping layer Cap includes ternary oxide (Mg—X—O), and the storage layer SL is in contact with ternary oxide (Mg—X—O) in the capping layer Cap. Herein, assume that ternary oxide (Mg—X—O) in the capping layer Cap and iron cobalt (FeCo) in the storage layer SL in the second configuration example take the fifth stacked structure. In this case, the lattice mismatch rate LMR between the storage layer SL and the capping layer Cap in the second configuration example is smaller than the lattice mismatch rate LMR between the storage layer SL and the capping layer Cap in the comparative example. Accordingly, the second configuration example is greater than the comparative example in terms of interfacial perpendicular magnetic anisotropy of the storage layer SL. The second configuration example is equivalent to the first configuration example in terms of interfacial perpendicular magnetic anisotropy of the storage layer SL.

In the third configuration example, the tunnel barrier layer TB and the capping layer Cap include ternary oxide (Mg—X—O), and the storage layer SL is in contact with ternary oxide (Mg—X—O) in the tunnel barrier layer TB and the capping layer Cap. Herein, assume that ternary oxide (Mg—X—O) in the tunnel barrier layer TB and iron cobalt (FeCo)

in the storage layer SL in the third configuration example take the second stacked structure, and ternary oxide (Mg—X—O) in the capping layer Cap and iron cobalt (FeCo) in the storage layer SL in the third configuration example take the fifth stacked structure. In this case, the lattice mismatch rate LMR between the tunnel barrier layer TB and the storage layer SL in the third configuration example is smaller than the lattice mismatch rate LMR between the tunnel barrier layer TB and the storage layer SL in the comparative example, and the lattice mismatch rate LMR between the storage layer SL and the capping layer Cap in the third configuration example is smaller than the lattice mismatch rate LMR between the storage layer SL and the capping layer Cap in the comparative example. Accordingly, the third configuration example is greater than the comparative example in terms of interfacial perpendicular magnetic anisotropy of the storage layer SL. Effects of improving interfacial perpendicular magnetic anisotropy of the storage layer SL can be obtained from both of the tunnel barrier layer TB and the capping layer Cap, so that interfacial perpendicular magnetic anisotropy of the storage layer SL in the third configuration example is greater than that of the storage layer SL in the first configuration example.

In the fourth configuration example, the tunnel barrier layer TB includes ternary oxide (Mg—X—O), and the storage layer SL is in contact with magnesium oxide (MgO) in the tunnel barrier layer TB. For this reason, the lattice mismatch rate LMR between the tunnel barrier layer TB and the storage layer SL in the fourth configuration example is equivalent to the lattice mismatch rate LMR between the tunnel barrier layer TB and the storage layer SL in the comparative example. Accordingly, the fourth configuration example is equivalent to the comparative example in terms of interfacial perpendicular magnetic anisotropy of the storage layer SL.

In the fifth configuration example, the tunnel barrier layer TB includes ternary oxide (Mg—X—O), and the storage layer SL is in contact with magnesium oxide (MgO) in the tunnel barrier layer TB. Furthermore, the capping layer Cap includes ternary oxide (Mg—X—O), and the storage layer SL is in contact with ternary oxide (Mg—X—O) in the capping layer Cap. Herein, assume that ternary oxide (Mg—X—O) in the capping layer Cap and iron cobalt (FeCo) in the storage layer SL in the fifth configuration example take the fifth stacked structure. In this case, the lattice mismatch rate LMR between the tunnel barrier layer TB and the storage layer SL in the fifth configuration example is equivalent to the lattice mismatch rate LMR between the tunnel barrier layer TB and the storage layer SL in the comparative example, and the lattice mismatch rate LMR between the storage layer SL and the capping layer Cap in the fifth configuration example is smaller than the lattice mismatch rate LMR between the storage layer SL and the capping layer Cap in the comparative example. Accordingly, the fifth configuration example is greater than the comparative example in terms of interfacial perpendicular magnetic anisotropy of the storage layer SL. The fifth configuration example is equivalent to the first configuration example in terms of interfacial perpendicular magnetic anisotropy of the storage layer SL.

Accordingly, a magnitude relationship of interfacial perpendicular magnetic anisotropy of the storage layer SL among the first to fifth configuration examples is expressed as the fourth configuration example <the first configuration example=the second configuration example=the fifth configuration example <the third configuration example.

(PA of Capping Layer Cap)

In the first configuration example, the capping layer Cap includes magnesium oxide (MgO). For this reason, RA of the capping layer Cap in the first configuration example is equivalent to RA of the capping layer Cap in the comparative example. The same applies to the fourth configuration example.

In the second configuration example, the capping layer Cap includes ternary oxide (Mg—X—O). For this reason, the second configuration example is lower than the comparative example in terms of RA of the capping layer Cap. The same applies to the third configuration example and the fifth configuration example.

Accordingly, a magnitude relationship of RA of the capping layer Cap among the first to fifth configuration examples is expressed as the second configuration example=the third configuration example=the fifth configuration example <the first configuration example=the fourth configuration example.

(Reliability of Tunnel Barrier Layer TB)

In the first configuration example, the tunnel barrier layer TB includes ternary oxide (Mg—X—O) and a film thickness of the tunnel barrier layer TB is greater than that of the tunnel barrier layer TB in the comparative example. For this reason, the first configuration example is higher than the comparative example in terms of reliability of the tunnel barrier layer TB. The same applies to the third configuration example.

In the second configuration example, the tunnel barrier layer TB includes magnesium oxide (MgO), and a film thickness of the tunnel barrier layer TB is substantially the same as that of the tunnel barrier layer TB in the comparative example. For this reason, the second configuration example is equivalent to the comparative example in terms of reliability of the tunnel barrier layer TB.

In the fourth configuration example, the tunnel barrier layer TB includes ternary oxide (Mg—X—O) and a film thickness of the tunnel barrier layer TB is greater than that of the tunnel barrier layer TB in the comparative example. For this reason, the fourth configuration example is higher than the comparative example in terms of reliability of the tunnel barrier layer TB. The fourth configuration example is smaller than the first configuration example in terms of a film thickness of the tunnel barrier layer TB. For this reason, the fourth configuration example is lower than the first configuration example in terms of reliability of the tunnel barrier layer TB. The same applies to the fifth configuration example.

Accordingly, a magnitude relationship of reliability of the tunnel barrier Layer TB among the first to fifth configuration examples is expressed as the second configuration example <the fourth configuration example=the fifth configuration example <the first configuration example=the third configuration example.

1.4. Effects of Present Embodiment

The magnetic memory device 1 according to the embodiment described above can improve characteristics of the memory cell MC. Hereinafter, effects of the magnetic memory device 1 according to the embodiment will be described in detail.

As the memory cell MC is miniaturized and narrowed in pitch, improved interfacial perpendicular magnetic anisotropy of the storage layer SL is required. Interfacial perpendicular magnetic anisotropy of the storage layer SL becomes greatest in a case where the lattice constant of the storage layer SL corresponds to the lattice constant of the nonmagnetic layer which is in contact with the storage layer SL.

Accordingly, as a difference (lattice mismatch rate LMR) between the lattice constant of the storage layer SL and the lattice constant of the nonmagnetic layer in contact with the storage layer SL increases, interfacial perpendicular magnetic anisotropy of the storage layer SL decreases. As interfacial perpendicular magnetic anisotropy of the storage layer SL decreases, the magnetization direction of the storage layer SL is more prone to reverse. In a case where the magnetization direction of the storage layer SL is prone to reverse, retention characteristics of the memory cell MC may decrease to cause failure in the memory cell MC.

As the memory cell MC is miniaturized and narrowed in pitch, reduction in resistance of the memory cell MC caused by film-thinning of the tunnel barrier layer TB is required. In a case where a film thickness of the tunnel barrier layer TB is relatively small, breakdown may occur in the tunnel barrier layer TB, thereby causing failure in the memory cell MC.

On the other hand, with the configuration according to the present embodiment, ternary oxide (Mg—X—O) can be used as the tunnel barrier layer TB or the capping layer Cap. This can reduce the lattice mismatch rate LMR between the tunnel barrier layer TB and the storage layer SL as compared with a case in which magnesium oxide (MgO) is used as the tunnel barrier layer TB. Furthermore, this can reduce the lattice mismatch rate LMR between the storage layer SL and the capping layer Cap as compared with a case in which magnesium oxide (MgO) is used as the capping layer Cap. Accordingly, interfacial perpendicular magnetic anisotropy of the storage layer SL increases as compared to a case in which magnesium oxide (MgO) is used as the tunnel barrier layer TB or the capping layer Cap. This can improve retention characteristics of the memory cell MC and prevent the occurrence of failure in the memory cell MC.

Furthermore, a film thickness of the tunnel barrier layer TB made from ternary oxide (Mg—X—O) can be increased as compared to that of the tunnel barrier TB made from magnesium oxide (MgO) under the condition that these tunnel barrier layers TB have the same PA. Accordingly, a breakdown of the tunnel barrier layer TB can be suppressed. This can improve reliability of the tunnel barrier layer TB and suppress the occurrence of failure in the memory cell MC.

Furthermore, RA of the capping layer Cap made from ternary oxide (Mg—X—O) can be decreased as compared to that of the capping layer Cap made from magnesium oxide (MgO). RA of the capping layer Cap leads to parasitic resistance of the memory cell MC. Thus, a write voltage can be reduced by decreasing RA of the capping layer Cap. Furthermore, a voltage margin between a bit in a low-resistance state (P state) and a bit in a high-resistance state (AP state) increases at the time of reading. Thus, the occurrence of failure in reading can be suppressed.

In addition, using ternary oxide (Mg—X—O) for the tunnel barrier layer TB or the capping layer Cap realizes relatively stable formation of the tunnel barrier layer TB or the capping layer Cap, as with a case of using magnesium oxide (MgO) for the tunnel barrier layer TB or the capping layer Cap.

2. Modifications, Etc

As described above, the magnetic memory device 1 according to the embodiment includes the first ferromagnetic layer 34 having a fixed magnetization direction, the second ferromagnetic layer 36 having a variable magnetization direction, the first nonmagnetic layer 35 provided between the first ferromagnetic layer 34 and the second ferromagnetic layer 36, and the nonmagnetic layer 37 provided on the opposite side to the side on which the nonmagnetic layer 35 is provided with respect to the ferromagnetic layer 36.

At least one of the first nonmagnetic layer 35 and the second nonmagnetic layer 37 is an oxide layer including magnesium (Mg) and a group 4 element. The group 4 element includes at least one element selected from a group consisting of zirconium (Zr), hafnium (Hf), and rutherfordium (Rf).

The embodiments are not limited to the above-described aspects, but can be modified in various ways.

The embodiment described the magnetic memory device 1 as an example of a magnetic device including an MTJ element (variable resistance element VR). However, this is not a limitation. Such a magnetic device may be another device that requires a magnetic element having interfacial perpendicular magnetic anisotropy, such as a sensor or medium. It suffices that such a magnetic element uses at least a variable resistance element VR.

Throughout the specification, the expression "coupling" refers to electrical coupling and does not exclude interposition of another element. Each of the nonmagnetic layers 31, 33, and 38 may be referred to as a "conductive layer". Each of the nonmagnetic layers 35 and 37 may be referred to as an "oxide layer". An element included in each layer of the MTJ element can be measured by, for example, using electron energy loss spectroscopy (EELS), etc. with a scanning transmission electron microscope (STEM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a first ferromagnetic layer having a fixed magnetization direction;
a second ferromagnetic layer having a variable magnetization direction;
a first nonmagnetic layer provided between the first ferromagnetic layer and the second ferromagnetic layer; and
a second nonmagnetic layer provided on an opposite side to a side on which the first nonmagnetic layer is provided with respect to the second ferromagnetic layer,
wherein at least one of the first nonmagnetic layer or the second nonmagnetic layer is an oxide layer including magnesium (Mg) and a group 4 element, and
the group 4 element includes at least one element selected from a group consisting of zirconium (Zr), hafnium (Hf), and rutherfordium (Rf).

2. The device according to claim 1, wherein the first nonmagnetic layer is the oxide layer, and the oxide layer is in contact with the second ferromagnetic layer.

3. The device according to claim 2, wherein the second nonmagnetic layer is the oxide layer, and the oxide layer is in contact with the second ferromagnetic layer.

4. The device according to claim 1, wherein the second nonmagnetic layer is the oxide layer, and the oxide layer is in contact with the second ferromagnetic layer.

5. The device according to claim 1, wherein the first nonmagnetic layer is the oxide layer, the oxide layer includes a structure in which a first oxide layer, a second oxide layer, and a third oxide layer are stacked in this order, the first oxide layer and the third oxide layer include magnesium (Mg), and the second oxide layer includes magnesium (Mg) and the group 4 element.

6. The device according to claim 5, wherein the second nonmagnetic layer is the oxide layer, and the oxide layer is in contact with the second ferromagnetic layer.

7. The device according to claim 1, wherein the oxide layer has a perovskite structure.

8. The device according to claim 7, wherein a surface of the oxide layer, the surface being in contact with the second ferromagnetic layer, is a first surface in which a magnesium (Mg) atom is located at each vertex of a unit lattice of a crystal structure of the oxide layer, and an oxygen (O) atom is located at a center of the unit lattice.

9. The device according to claim 7, wherein a surface of the oxide layer, the surface being in contact with the second ferromagnetic layer, is a second surface in which an atom of the group 4 element is located at a center of a unit lattice of a crystal structure of the oxide layer, and an oxygen (O) atom is located at a midpoint of each side of the unit lattice.

10. The device according to claim 1, wherein a band gap of the oxide layer is narrower than a band gap of magnesium oxide (MgO).

11. The device according to claim 1, wherein the second ferromagnetic layer includes at least one element selected from a group consisting of iron (Fe), cobalt (Co), and nickel (Ni).

12. The device according to claim 1, wherein the second ferromagnetic layer includes iron (Fe) and cobalt (Co), and a lattice mismatch ratio between the oxide layer and the second ferromagnetic layer is lower in absolute value than a lattice mismatch ratio between magnesium oxide (MgO) and the second ferromagnetic layer.

13. The device according to claim 1, further comprising:
a first conductive layer provided so as to extend in a first direction;
a second conductive layer provided so as to extend in a second direction intersecting the first direction and be spaced apart from the first conductive layer; and
a memory cell provided between the first conductive layer and the second conductive layer,
wherein the memory cell includes the first ferromagnetic layer, the first nonmagnetic layer, the second ferromagnetic layer, and the second nonmagnetic layer.

14. The device according to claim 13, wherein the memory cell includes a variable resistance element.

15. The device according to claim 14, wherein the variable resistance element is a magnetoresistance effect element.

16. A magnetic memory device comprising:

a first ferromagnetic layer having a fixed magnetization direction;

a second ferromagnetic layer having a variable magnetization direction;

a first nonmagnetic layer provided between the first ferromagnetic layer and the second ferromagnetic layer; and a second nonmagnetic layer provided on an opposite side to a side on which the first nonmagnetic layer is provided with respect to the second ferromagnetic layer, wherein at least one of the first nonmagnetic layer or the second nonmagnetic layer is an oxide layer including magnesium (Mg) and titanium (Ti), and the oxide layer has a perovskite structure.

17. The device according to claim 16, wherein the first nonmagnetic layer is the oxide layer, and the oxide layer is in contact with the second ferromagnetic layer.

18. The device according to claim 16, wherein the second nonmagnetic layer is the oxide layer, and the oxide layer is in contact with the second ferromagnetic layer.

19. The device according to claim 16, wherein a surface of the oxide layer, the surface being in contact with the second ferromagnetic layer, is a first surface in which a magnesium (Mg) atom is located at each vertex of a unit lattice of a crystal structure of the oxide layer, and an oxygen (O) atom is located at a center of the unit lattice.

20. The device according to claim 16, wherein a surface of the oxide layer, the surface being in contact with the second ferromagnetic layer, is a second surface in which a titanium (Ti) atom is located at a center of a unit lattice of a crystal structure of the oxide layer, and an oxygen (O) atom is located at a midpoint of each side of the unit lattice.

\*    \*    \*    \*    \*